United States Patent
Kawa et al.

(10) Patent No.: US 12,368,100 B1
(45) Date of Patent: Jul. 22, 2025

(54) INTERCONNECTS, INDUCTORS, TRANSFORMERS, AND POWER ARCHITECTURES FOR CIRCUITS

(71) Applicant: Synopsys, Inc., Mountain View, CA (US)

(72) Inventors: Jamil Kawa, Campbell, CA (US); Stephen Robert Whiteley, Sunnyvale, CA (US); Victor Moroz, Saratoga, CA (US)

(73) Assignee: SYNOPSYS, INC., Sunnyvale, CA (US)

( * ) Notice: Subject to any disclaimer, the term of this patent is extended or adjusted under 35 U.S.C. 154(b) by 434 days.

(21) Appl. No.: 18/167,731

(22) Filed: Feb. 10, 2023

Related U.S. Application Data

(60) Provisional application No. 63/428,721, filed on Nov. 29, 2022.

(51) Int. Cl.
| | |
|---|---|
| *H01L 23/528* | (2006.01) |
| *H01L 23/532* | (2006.01) |
| *H10D 1/20* | (2025.01) |
| *H10D 1/47* | (2025.01) |

(52) U.S. Cl.
CPC ...... *H01L 23/528* (2013.01); *H01L 23/53285* (2013.01); *H10D 1/20* (2025.01); *H10D 1/474* (2025.01)

(58) Field of Classification Search
CPC ... H01L 23/528; H01L 23/53285; H10D 1/20; H10D 1/474
See application file for complete search history.

(56) References Cited

U.S. PATENT DOCUMENTS

| | | | | |
|---|---|---|---|---|
| 2016/0149111 | A1* | 5/2016 | Cybart | H10N 60/124 505/190 |
| 2017/0148972 | A1* | 5/2017 | Thompson | H10N 60/805 |
| 2018/0013052 | A1* | 1/2018 | Oliver | H10N 60/805 |
| 2019/0043919 | A1* | 2/2019 | George | H10N 60/12 |
| 2019/0058005 | A1* | 2/2019 | Pesetski | H10N 69/00 |
| 2022/0121978 | A1* | 4/2022 | Woods | H10N 60/12 |
| 2022/0293845 | A1* | 9/2022 | Phung | H10D 1/68 |

\* cited by examiner

*Primary Examiner* — Omar F Mojaddedi
(74) *Attorney, Agent, or Firm* — Laxman Sahasrabuddhe; Park, Vaughan, Fleming & Dowler LLP

(57) ABSTRACT

A structure may include a set of metal layers disposed on a substrate layer, where a dielectric material is disposed between adjacent metal layers in the set of metal layers. The structure may include a first superconducting structure and a second superconducting structure created in a metal layer selected from the set of metal layers. The first superconducting structure may have a first length along a first direction which is parallel to a primary routing direction of the metal layer, a second length along a second direction which is parallel to the substrate layer and perpendicular to the first direction, and a third length along a third direction which is directed away from the substrate layer and perpendicular to the first direction and the second direction. The third length may be greater than the second length.

20 Claims, 5 Drawing Sheets

INTERCONNECTS, INDUCTORS, TRANSFORMERS, AND POWER ARCHITECTURES FOR CIRCUITS

RELATED APPLICATION

This application claims the benefit of U.S. Provisional Application Ser. No. 63/428,721, filed on 29 Nov. 2022, the contents of which are herein incorporated by reference in their entirety for all purposes.

TECHNICAL FIELD

The present disclosure generally relates to electronic circuits. More specifically, the present disclosure relates to interconnects, inductors, transformers, and power architectures for circuits.

BACKGROUND

An increasing demand for computing and storage capacity has fueled an increase in the size and complexity of integrated circuit (IC) designs. The performance, reliability, and cost of IC designs may depend on the interconnects, inductors, transformers, and power architectures used in complementary metal-oxide semiconductor (CMOS) and superconducting electronics (SCE).

SUMMARY

A structure may include a set of metal layers disposed on a substrate layer, where a dielectric material is disposed between adjacent metal layers in the set of metal layers. The structure may include a first superconducting structure and a second superconducting structure created in a metal layer selected from the set of metal layers.

In some embodiments described herein, the first superconducting structure may have a first length along a first direction which is parallel to a primary routing direction of the metal layer, a second length along a second direction which is parallel to the substrate layer and perpendicular to the first direction, and a third length along a third direction which is directed away from the substrate layer and perpendicular to the first direction and the second direction. The third length may be greater than the second length. The second superconducting structure may have a fourth length along the first direction, a fifth length along the second direction, and a sixth length along the third direction. The sixth length may be greater than the fifth length.

In some embodiments described herein, the second length and the fifth length may be less than or equal to 500 nm. In some embodiments described herein, the third length and the sixth length may be greater than or equal to 1 μm.

In some embodiments described herein, the first superconducting structure may be part of a passive transmission line. In some embodiments described herein, the first superconducting structure may be part of an inductor. In some embodiments described herein, the first superconducting structure and the second superconducting structure may be plates of a transformer.

In some embodiments described herein, the second superconducting structure may be maintained at a ground voltage. An impedance of the first superconducting structure may be substantially based on a current loop formed by the first superconducting structure and the second superconducting structure.

In some embodiments described herein, the first superconducting structure and the second superconducting structure may be made of niobium, aluminum, or lead. In some embodiments described herein, the first superconducting structure and the second superconducting structure may be surrounded by a dielectric material. In some embodiments described herein, the dielectric material may be silicon dioxide.

In some embodiments described herein, an impedance of the first superconducting structure may be between 8Ω and 16Ω.

In some embodiments, a resistive structure may be created in a metal layer selected from a set of metal layers, where the resistive structure has a first length along a first direction which is parallel to a primary routing direction of the metal layer, where the resistive structure has a second length along a second direction which is parallel to the metal layer and perpendicular to the first direction, where the resistive structure has a third length along a third direction which is directed away from the metal layer and perpendicular to the first direction and the second direction, and where the third length may be greater than the second length.

BRIEF DESCRIPTION OF THE FIGURES

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1A:
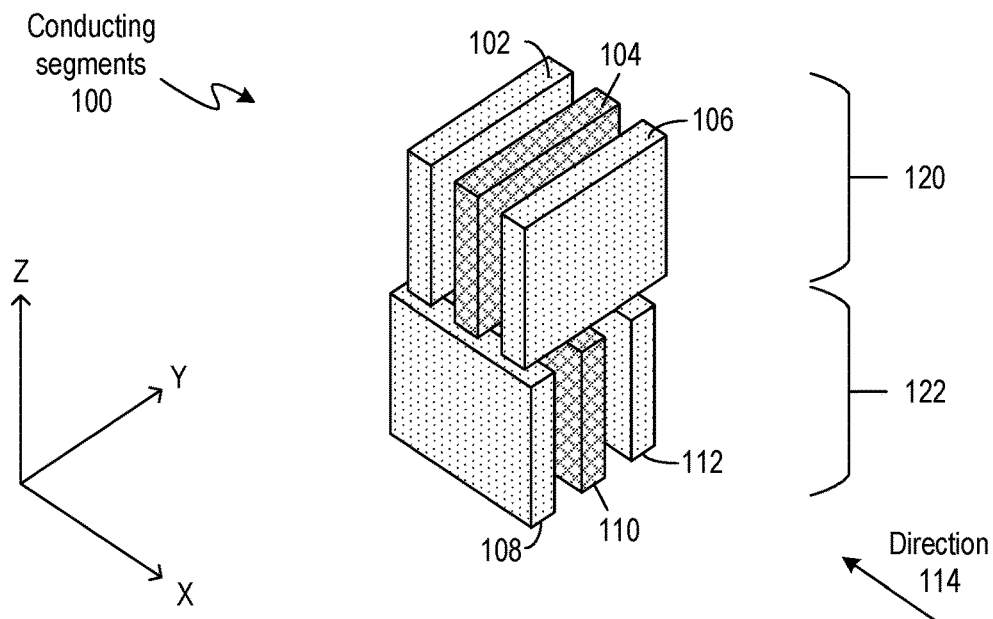
FIGS. 1A-1B illustrate conducting segments in accordance with some embodiments described herein.

Embodiments described herein may feature interconnects, inductors, transformers, and power architectures for circuits. CMOS technology, which is widely used for fabricating IC designs, uses p-type and n-type transistors to implement logic gates. SCE generally refers to electronic circuits that may include active and passive components, and that are designed to be operated below a critical temperature, where at least some of the components exhibit superconducting behavior.

SCE can operate at frequencies in excess of 30 GHz and as high as 100 GHz and while at the same time use ultra-low power because of the zero interconnect resistance at the nominal operating temperature of 4° K. However, interconnects, inductors, transformers, and power architectures used in some SCEs may use excessive area, create large return path loops, prevent scaling to smaller feature sizes, significantly limit the number of gates that can be implemented in an SCE circuit, increase complexity of placement and routing, and/or degrade the quality of GND planes.

Embodiments described herein may create metal features that are rotated by 90°. For example, instead of using metal features with a 5 μm width, embodiments described herein may use metal features with a 5 μm height and a substantially smaller width (e.g., 200 nm). Creating interconnects, inductors, transformers, and power architectures using metal features that are rotated by 90° can overcome the above-described problems.

Technical advantages of embodiments described herein include, but are not limited to, (1) substantially increasing the integration density by using substantially smaller pitches for PTLs and inductors, (2) increasing integrity of GND planes (because they are contiguous do not include feed-throughs), (3) achieving desired impedances (e.g., 8Ω) using smaller feature sizes (e.g., using a 2 μm height instead of a 5 μm height), (4) increasing routing resources because entire metal layers are not used as GND planes, (5) eliminating the use of feed through routing in GND planes, (6) making connectivity between GND planes easier which improves shielding, (7) allowing interconnects, inductors, and transformers to scale with standard cells to lower technology nodes, and (8) reduce flux trapping problems in the SCE.

Some SCE components are based on single flux quantum (SFQ) technology, which relies on the quantum mechanical quantization of magnetic flux. Although SFQ technology may come in many flavors, all SFQ technologies are based on flux storage and transmission, and use pulses emitted by Josephson Junctions. A Josephson Junction (JJ) may include two superconducting structures separated by a non-superconducting structure. In this disclosure, the non-superconducting structure that separates two superconducting structures may be referred to as a junction. In a JJ, the junction may support a current that may flow indefinitely without any voltage being applied across the junction.

Examples of superconducting materials that may be used to construct a superconducting structure include, but are not limited to, aluminum (Al), niobium (Nb), and lead (Pb). In some embodiments, a non-superconducting structure may be a thin insulating tunnel barrier that is made of aluminum/aluminum oxide (Al/AlOx). In other embodiments, a non-superconducting structure may be made of a conducting material, such as silver (Ag), copper (Cu), or gold (Au), that does not exhibit superconductivity at low temperatures. In yet other embodiments, a non-superconducting structure may be a multilayered structure that may include one or more magnetic, non-magnetic, insulating, conducting, or ferromagnetic layers. In some embodiments, the non-superconducting structure is made of a superconducting material that has defects (which may have been introduced into the superconducting material by using a suitable technique, e.g., an electron beam), which prevent superconductivity at low temperatures.

The area used by SCE to realize anything more than basic hand-packed circuits with less than 100,000 gates may be prohibitively large. One reason why SCE may use large amounts of area is because it may not be possible to scale the interconnect feature size to a smaller size as the process node shrinks because a characteristic impedance of 8Ω to 16Ω is desired to be maintained. Specifically, in some SCE designs, scaling the interconnect feature size to smaller sizes may cause the characteristic impedance of the interconnect to be substantially greater than 16Ω. The term "process node" may refer to the smallest feature dimension that can be reliably manufactured by a semiconductor manufacturing process. For example, the term "5 nm node" may refer to a semiconductor manufacturing process that can reliably manufacture 5 nm features. A typical width and spacing of a passive transmission line (PTL) interconnect in SCE is 5 μm and 5 μm, respectively.

Additionally, metal layers which are maintained at a ground voltage (which may be referred to as "GND planes") may provide an inductive return path for PTLs and may consume a significant number of metal layers, which may reduce the available resources for routing in the metal layers. The term "inductive return path" may refer to a current path which is part of an inductive current loop. Thus, if a large portion of the current flowing through a PTL forms a current loop with a nearby GND plane, then the inductance of the PTL is largely dependent on the cross-sectional area of this current loop.

For example, a typical state of the art process may include 7 metal layers of which 3 metal layers may be used by GND planes and the remaining 4 non-contiguous metal layers may be used for routing PTLs. As one specific example, suppose the 7 metal layers are labeled M1 through M7, where M1 is closest to the substrate. In this example, metal layers M1, M4, and M7 may be used as GND planes. In other words, the metal layers M1, M4, and M7 may be almost fully covered with metal which is maintained at a ground voltage. Metal layer M2 may include PTLs which are routed along a first direction, metal layer M3 may include PTLs which are routed along a second direction (which may be perpendicular to the first direction). The GND planes on metal layers M1 and M4 may provide shielding and inductive return paths for the PTLs on metal layers M2 and M3. Metal layers M5 and M6 may include SCE gates, which may include one or more JJs. Metal layers M4 and M7 may provide shielding for the gates on metal layers M5 and M6.

Sandwiching routing layers (e.g., metal layers M2 and M3 in the above example) between GND planes (e.g., metal layers M1 and M4 in the above example) may cause the impedance variability from one layer to the next layer excessive. It may also cause the impedance to be higher (e.g., due to the larger current loop cross-section formed by the PTLs in a metal layer and the return path in a GND plane), which may cause the width of the PTL to be even larger to maintain a desired impedance. Additionally, alternating routing layers with GND planes translates to the need of "feed-throughs" in the GND planes, which can complicate placement and routing and can degrade the quality of the GND planes. The term "feed-through" may refer to a connection that passes through a GND plane in the vertical direction. For example, in the above example, a connection from metal layer M3 to metal layer M5 may pass through the GND plane on metal layer M4.

From an IC layout perspective, inductors are similar to PTLs or microstrips. Therefore, the problems with excessive area consumption and large return path loops that apply to PTLs also apply to inductors. Some SCE technologies (which may include, but is not limited to, rapid single flux quantum technology) use direct current (DC) biasing, whereas some SCE technologies (which may include, but is not limited to, adiabatic quantum-flux-parametron technology) use alternating current (AC) biasing. SCE technologies that use AC biasing may use transformers, which may be implemented using conductors in two adjacent metal layers. For example, a first plate of the transformer may be created in metal layer M2 and a second plate of the transformer may be created in metal layer M3. The inter-layer dielectric between M2 and M3 may provide inductive coupling between the two plates. However, creating transformers using two adjacent metal layers also have the same problems as PTLs.

In summary, some implementations of interconnects, inductors, transformers, and power architecture may use excessive area, create large return path loops, prevent scaling to smaller feature sizes, significantly limit the number of gates that can be implemented in an SCE circuit, increase complexity of placement and routing, and/or degrade the quality of GND planes.

Embodiments described herein may create metal features that are rotated by 90°. For example, instead of using metal features with a 5 µm width, embodiments described herein may use metal features with a 5 µm height and a substantially smaller width (e.g., 200 nm). Moreover, the GND plane may be created by using metal features in the same layer as the PTL or inductor, and the GND plane features may be placed at the minimum spacing allowed by the process technology. In some embodiments described herein, transformers may be implemented using two metal features on the same metal layer that may be separated by a minimum spacing allowed by the process technology.

Without loss of generality, in this disclosure, the wafer surface is assumed to be parallel to the XY plane, the length of a structure along the X direction is referred to as the length of the structure, the length of the structure along the Y direction is referred to as the width of the structure, and the length of the structure along the Z direction is referred to as the height or thickness/thinness of the structure.

Figure 1B:
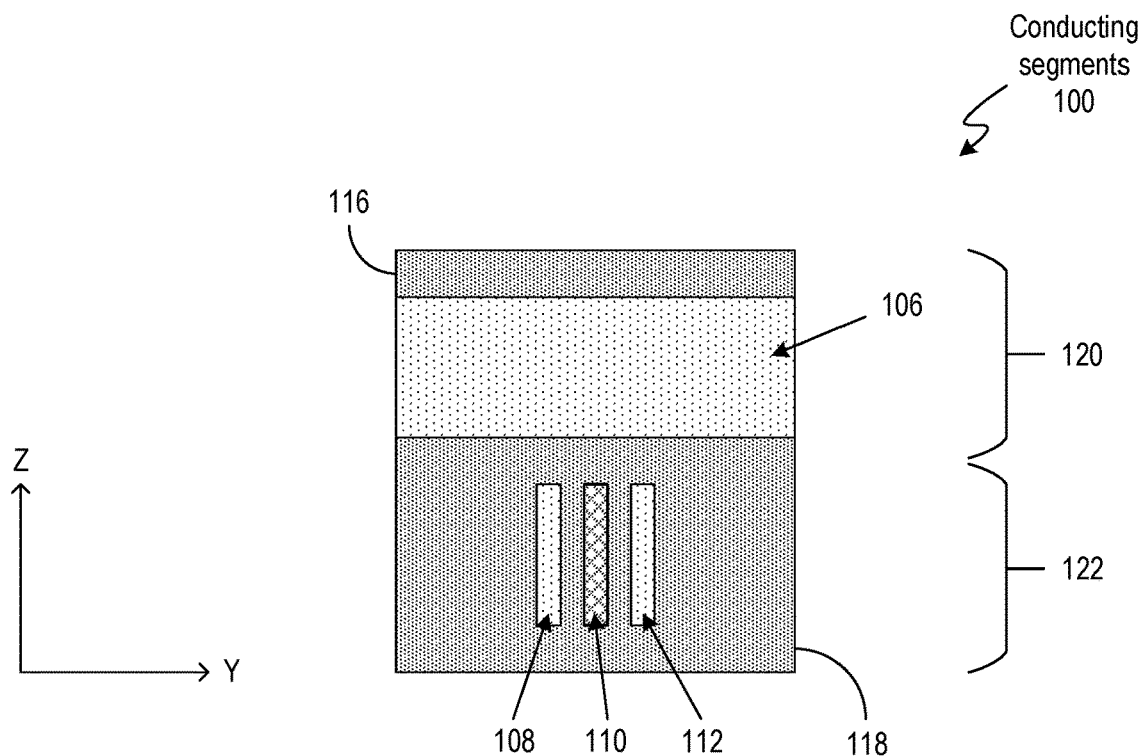

FIGS. 1A-1B illustrate conducting segments in accordance with some embodiments described herein.

The three-dimensional view of conducting segments 100 shown in FIG. 1A includes conducting segments in two adjacent metal layers 120 and 122. For example, metal layer 120 may correspond to metal layer M3, and metal layer 122 may correspond to metal layer M2 in a process technology. A dielectric material may surround conducting segments 100, which is not shown in FIG. 1A.

Specifically, metal layer 120 may include conducting segments 102, 104, and 106, and metal layer 122 may include conducting segments 108, 110, and 112. Each conducting segment may be part of an interconnect or an inductor. For example, conducting segment 102 may be part of a PTL that connects an output port of a first SCE gate with an input port of a second SCE gate.

Each metal layer may have a primary routing direction, which may be a direction along which substantially all interconnects in the metal layer are routed. For example, the primary routing direction in metal layer 120 may be along the Y direction and the primary routing direction in metal layer 122 may be along the X direction.

FIG. 1B illustrates a cross-sectional view of conducting segments 100, where the cross-section is taken along the YZ plane. Specifically, FIG. 1B may illustrate a cross-sectional view of conducting segments 100 when viewed along direction 114 shown in FIG. 1A. Inter-layer dielectric (e.g., silicon dioxide) 118 may surround conducting segments 108, 110, and 112. Additionally, inter-layer dielectric 116 and 118 may insulate conducting segments in different metal layers (e.g., metal layers 120 and 122) from each other.

The inductance contributed by a conducting segment may depend on the surface area of the conducting segment that faces the GND plane. For example, the inductance contributed by conducting segment 102 may depend on the surface area along the YZ plane (i.e., the product of the dimensions of conducting segment 102 along the Y and Z directions). Likewise, the inductance contributed by conducting segment 108 may depend on the surface area along the XZ plane (i.e., the product of the dimensions of conducting segment 108 along the X and Z directions).

When semiconductor manufacturing moves to smaller technology nodes, the feature dimensions along the X and Y directions may decrease. Embodiments described herein allow the height of conducting segments 100 to be maintained with shrinking technology nodes, which may cause the inductance contributed by conducting segments 100 to remain at a desired value, which, in turn, may cause the PTLs and/or inductances to have a desired impedance (e.g., 8Ω to 16Ω) while allowing the PTLs and/or inductances to be scaled to smaller features just like standard cells.

Current loops may be formed in the same metal layer. For example, conducting segments 102 and 106 may be maintained at ground voltage and conducting segment 104 may be used to create a PTL or an inductance. Likewise, conducting segments 108 and 112 may be maintained at ground voltage and conducting segment 110 may be used to create a PTL or an inductance. Thus, a current loop may be formed between conducting segment 104 and conducting segments 102 and 106 in metal layer 120. Likewise, a current loop may be formed between conducting segment 110 and conducting segments 108 and 112 in metal layer 122. The inductance contributed by conducting segments 104 and 110 may correspond to the cross-section of these current loops.

Figure 2A:
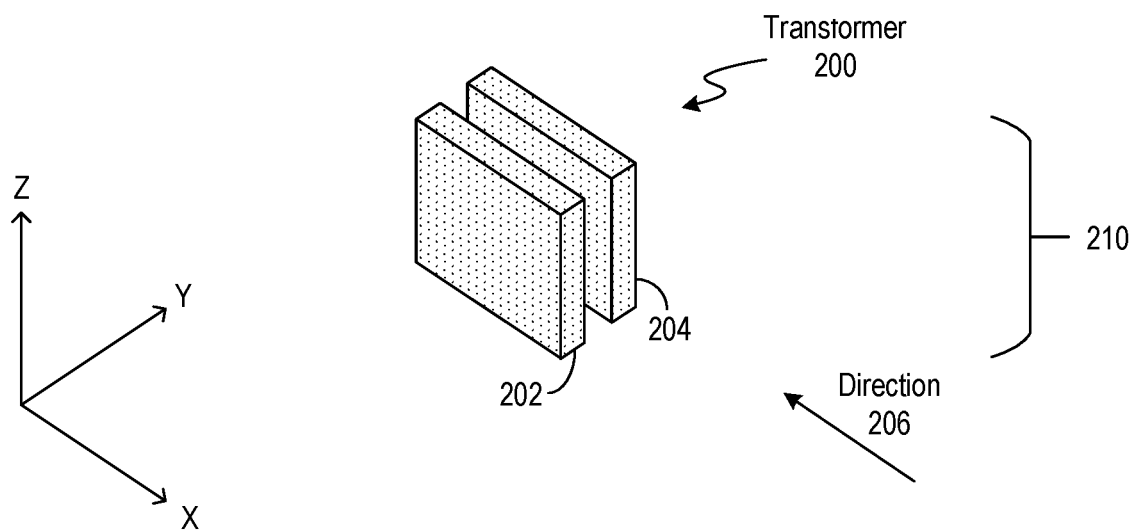
FIGS. 2A-2B illustrate a transformer in accordance with some embodiments described herein.
Figure 2B:
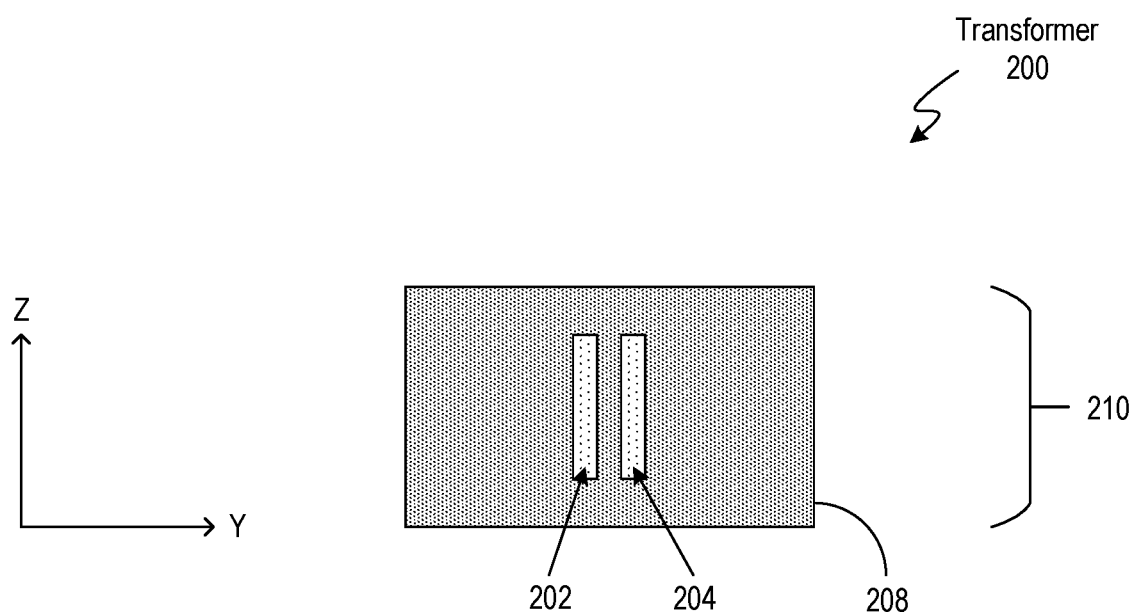

FIGS. 2A-2B illustrate a transformer in accordance with some embodiments described herein.

The three-dimensional view of transformer 200 shown in FIG. 2A includes plates 202 and 204 which are constructed in the same metal layer. For example, plates 202 and 204 may be constructed in metal layer 210, which may correspond to metal layer M2 in a process technology. A dielectric material may surround plates 202 and 204, which is not shown in FIG. 2A.

FIG. 2B illustrates a cross-sectional view of transformer 200, where the cross-section is taken along the YZ plane. Specifically, FIG. 2B may illustrate a cross-sectional view of transformer 200 when viewed along direction 206 shown in FIG. 2A. Inter-layer dielectric (e.g., silicon dioxide) 208 may surround plates 202 and 204. Inter-layer dielectric 208 may insulate transformer 200 from other metal layers.

The inductive coupling between plates 202 and 204 may depend on the overlapping surface area of the plates that are facing each other. For example, the inductive coupling between plates 202 and 204 may depend on the overlapping surface area of plates 202 and 204 along the XZ plane (i.e., the product of the dimensions of plates 202 and 204 along the X and Z directions).

When semiconductor manufacturing moves to smaller technology nodes, the feature dimensions along the X and Y directions may decrease. Embodiments described herein allow the height of plates 202 and 204 to be maintained with shrinking technology nodes, which may cause the inductive coupling between plates 202 and 204 to remain at a desired value, which, in turn, may cause transformer 200 to have a desired amount of inductive coupling between plates 202 and 204 while allowing the transformer geometry to be scaled to smaller features just like standard cells.

In transformer 200, the inductive coupling between plates 202 and 204 is in the same metal plane. For example, the inductive coupling between plates 202 and 204 is realized in metal layer 210. The amount of inductive coupling (which may determine the performance of the transformer 200) between plates 202 and 204 may correspond to overlapping surface area of plates 202 and 204 along the XZ plane.

FIGS. 3A-3E illustrate a process for creating conducting structures in accordance with some embodiments described herein.

Figure 3A:
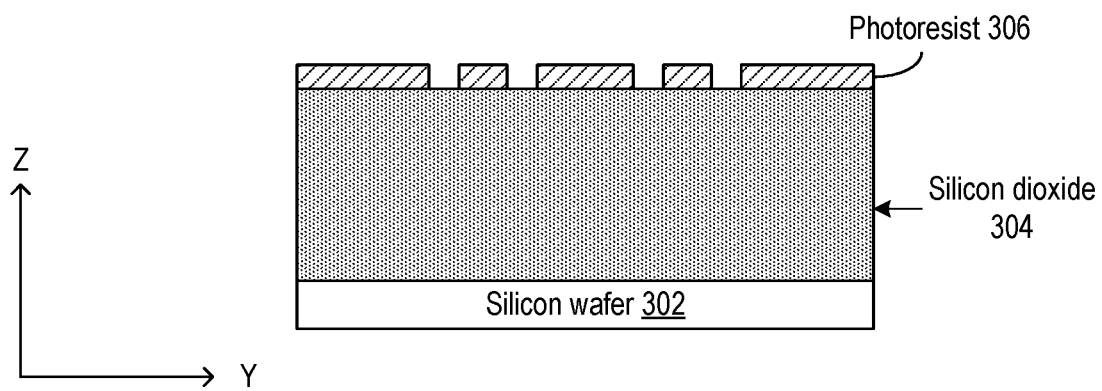
FIGS. 3A-3E illustrate a process for creating conducting structures in accordance with some embodiments described herein.
Figure 3B:
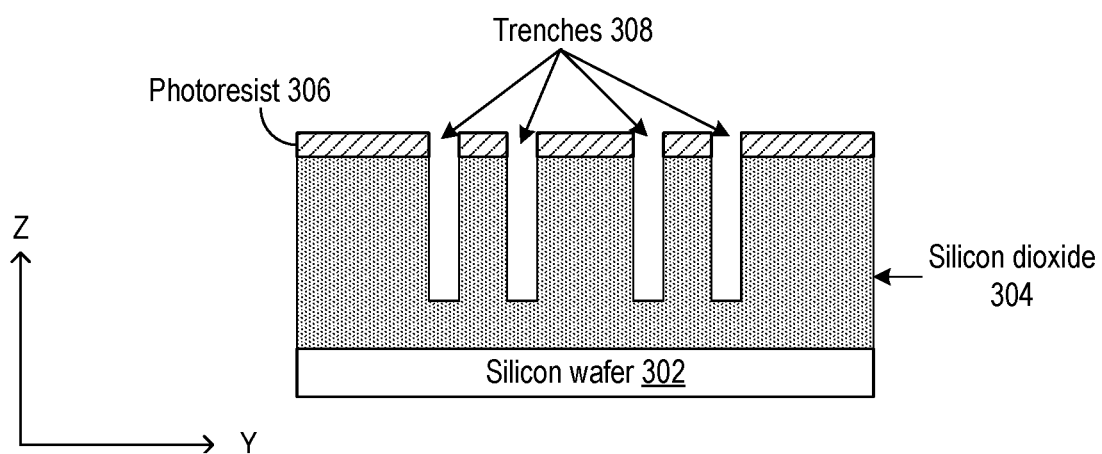
Figure 3C:
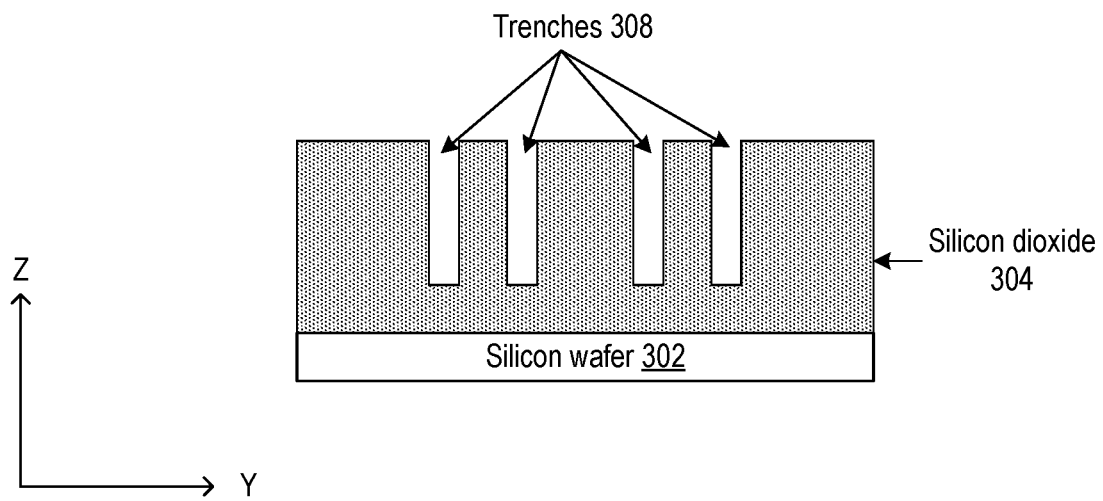
Figure 3D:
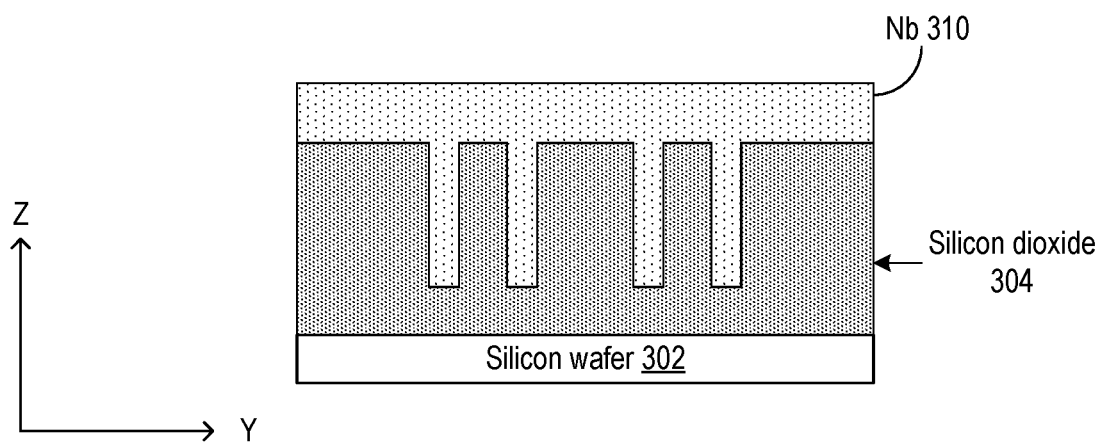

The process may begin by depositing silicon dioxide 304 on a silicon wafer 302 and use lithography to create a photoresist pattern 306 (FIG. 3A). The exposed silicon dioxide 304 may be etched to create trenches 308 (FIG. 3B) and the photoresist may be removed (FIG. 3C). A conducting material (e.g., Nb) may be deposited to fill the trenches 308 and form structure 310 (FIG. 3D). Chemical mechanical polishing may be performed to remove the excess conducting material to form the conducting structures 312 which are surrounded by an inter-layer dielectric, e.g., silicon dioxide 304. A conducting structure in conducting structures 312 may correspond to (1) a conducting segment (e.g., conducting segment 108) of an interconnect or an inductor or (2) a plate (e.g., plate 202) of a transformer.

In other words, the conducting structures may be created by: (1) creating a set of trenches of a desired height in an inter-layer dielectric material, where each trench corresponds to a conducting structure which is desired to be created, (2) depositing a conducting material to fill the set of trenches, and (3) optionally removing excess conducting material.

Figure 3E:
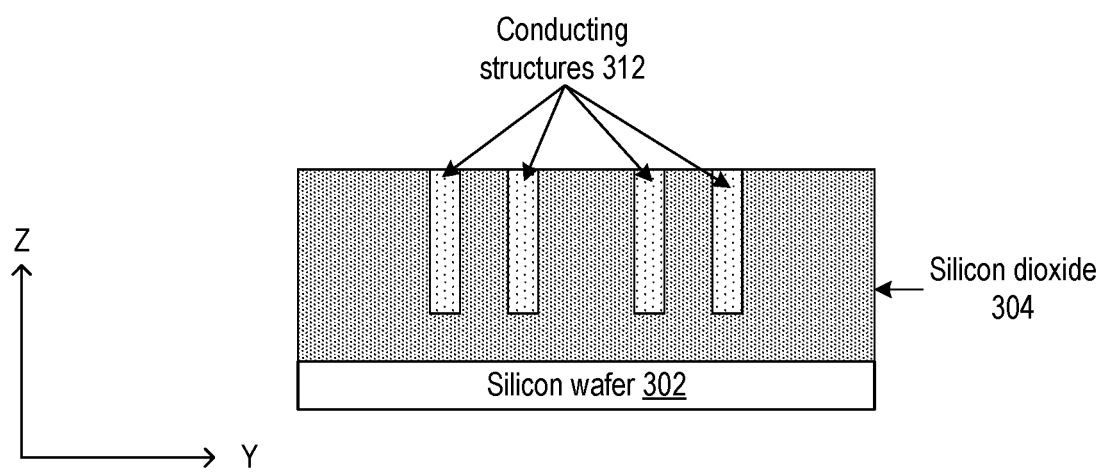

In some embodiments described herein, a structure may include a set of metal layers disposed on a substrate layer, where a dielectric material is disposed between adjacent metal layers in the set of metal layers. For example, FIG. 3E illustrates a structure which includes a substrate (e.g., silicon wafer 302) and FIG. 1B illustrates metal layers 120 and 122 which may be disposed on the substrate (not shown in FIG. 1). The structure may include a first superconducting structure and a second superconducting structure created in a metal layer selected from the set of metal layers. For example, FIG. 3E illustrates conducting structures 312.

In some embodiments described herein, the first superconducting structure may have a first length along a first direction which is parallel to a primary routing direction of the metal layer, a second length along a second direction which is parallel to the substrate layer and perpendicular to the first direction, and a third length along a third direction which is directed away from the substrate layer and perpendicular to the first direction and the second direction. The third length may be greater than the second length. For example, in metal layer 122 shown in FIG. 1A, the first direction may be along the X direction, the second direction may be along the Y direction, and the third direction may be along the Z direction. As shown in FIG. 1A, the third length (i.e., along the Z direction) of conducting segment 108 is greater than the second length (i.e., along the Y direction) of conducting segment 108. In some embodiments described herein, the second length may be less than or equal to 500 nm, and the third length may be greater than or equal to 1 µm.

The second superconducting structure may have a fourth length along the first direction, a fifth length along the second direction, and a sixth length along the third direction. The sixth length may be greater than the fifth length. For example, in FIG. 1A, conducting segment 110 may be the second superconducting structure, and the sixth length of (i.e., along the Z direction) of conducting segment 110 is greater than the fifth length (i.e., along the Y direction) of conducting segment 110. In some embodiments described herein, the fifth length may be less than or equal to 500 nm, and the sixth length may be greater than or equal to 1 µm.

In some embodiments described herein, the first superconducting structure may be part of a PTL. In some embodiments described herein, the first superconducting structure may be part of an inductor. For example, the first superconducting structure may be conducting segment 110 in FIG. 1A, which may be part of a PTL or an inductor. In some embodiments described herein, the first superconducting structure and the second superconducting structure may be plates of a transformer. For example, the first superconducting structure and the second superconducting structure may be plates 202 and 204, respectively, which are part of transformer 200.

In some embodiments described herein, the second superconducting structure may be maintained at a ground voltage. For example, in FIG. 1A, the first superconducting structure may be conducting segment 110 and the second superconducting structure may be conducting segment 112, where conducting segment 110 may be part of a PTL or an inductor and conducting segment 112 may be maintained at a ground voltage (because it is part of a GND plane). An impedance of the first superconducting structure (e.g., conducting segment 110) may be substantially based on a current loop formed by the first superconducting structure (e.g., conducting segment 110) and the second superconducting structure (e.g., conducting segment 112).

In some embodiments described herein, the first superconducting structure and the second superconducting structure (e.g., conducting segments 110 and 112) may be made of niobium, aluminum, or lead. In some embodiments described herein, the first superconducting structure and the second superconducting structure may be surrounded by a dielectric material. For example, conducting segments 110 and 112 are surrounded by inter layer dielectric material 118. In some embodiments described herein, the dielectric material (e.g., inter layer dielectric material 118) may be silicon dioxide.

In some embodiments described herein, an impedance of the first superconducting structure may be between 8Ω and 16Ω. For example, conducting segment 110 in FIG. 1A may be part of a PTL or an inductor, and the impedance seen at a terminal of the PTL or inductor may be between 8Ω and 16Ω.

Some of the embodiments described herein have been presented in the context of SCE. However, embodiments described herein may also be used for creating structures in CMOS circuits. For example, in some embodiments, conducting segments 100 in FIG. 1A, transformer 200 in FIG. 2A, and conducting structures 312 in FIG. 3E may be made of a conducting material (e.g., a material used in a CMOS process technology for creating interconnects) which may not exhibit superconducting properties below a critical temperature.

In some SCE circuits, resistor devices may be used for damping of the JJs, for providing damping termination to PTLs, and/or for other applications which use resistances. A resistor device may be created using thin-film resistive materials such as molybdenum and molybdenum nitride, and in a horizontal configuration. For example, a resistor device may be created along the XY plane in FIG. 1A. However, creating resistor devices in the XY plane may use a significant amount of area in the XY plane. In some embodiments described herein, a resistor device may be created using a trench (e.g., trenches 308 in FIG. 3C), i.e., the resistor is created in a vertical configuration. As was the case for PTLs and inductors, creating a resistor in the Z direction instead of the XY plane may use substantially less area in the XY plane, which can significantly increase integration densities. Thus, in some embodiments described herein, the conducting structures (e.g., conducting segments 100 in FIG. 1A and conducting structures 312 in FIG. 3E) may be made of a resistive material (which may have a non-zero resistance at low temperatures, e.g., at 4° K), e.g., molybdenum and molybdenum nitride.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A structure, comprising:
    a set of metal layers disposed on a substrate layer, wherein a dielectric material is disposed between adjacent metal layers in the set of metal layers;
    a first superconducting structure created in a metal layer selected from the set of metal layers, wherein the first superconducting structure has a first length along a first direction which is parallel to a primary routing direction of the metal layer, wherein the first superconducting structure has a second length along a second direction which is parallel to the substrate layer and perpendicular to the first direction, wherein the first superconducting structure has a third length along a third direction which is directed away from the substrate layer and perpendicular to the first direction and the second direction, and wherein the third length is greater than the second length; and
    a second superconducting structure created in the metal layer.

2. The structure of claim 1, wherein the first superconducting structure is part of a passive transmission line.

3. The structure of claim 1, wherein the first superconducting structure is part of an inductor.

4. The structure of claim 1, wherein the first superconducting structure and the second superconducting structure are plates of a transformer.

5. The structure of claim 1, wherein the second superconducting structure is maintained at a ground voltage.

6. The structure of claim 1, wherein an impedance of the first superconducting structure is substantially based on a current loop formed by the first superconducting structure and the second superconducting structure.

7. The structure of claim 1, wherein the first superconducting structure and the second superconducting structure are made of niobium, aluminum, or lead.

8. The structure of claim 1, wherein the first superconducting structure and the second superconducting structure are surrounded by a dielectric material.

9. The structure of claim 8, wherein the dielectric material is silicon dioxide.

10. The structure of claim 1, wherein an impedance of the first superconducting structure is between 8Ω and 16Ω.

11. The structure of claim 1, wherein the second length is less than or equal to 500 nm.

12. The structure of claim 11, wherein the third length is greater than or equal to 1 μm.

13. A structure, comprising:
    a superconducting structure created in a metal layer selected from a set of metal layers, wherein the superconducting structure has a first length along a first direction which is parallel to a primary routing direction of the metal layer, wherein the superconducting structure has a second length along a second direction which is parallel to the metal layer and perpendicular to the first direction, wherein the superconducting structure has a third length along a third direction which is directed away from the metal layer and perpendicular to the first direction and the second direction;
    wherein the second length is less than or equal to 500 nm; and
    wherein the third length is greater than or equal to 1 μm.

14. The structure of claim 13, wherein the superconducting structure is part of a passive transmission line.

15. The structure of claim 13, wherein the superconducting structure is part of an inductor.

16. The structure of claim 13, wherein the superconducting structure is a plate of a transformer.

17. The structure of claim 13, wherein the superconducting structure is surrounded by a dielectric material.

18. The structure of claim 17, wherein the dielectric material is silicon dioxide.

19. The structure of claim 13, wherein an impedance of the superconducting structure is between 8Ω and 16Ω.

20. A superconducting electronics circuit, comprising:
    a resistive structure created in a metal layer selected from a set of metal layers, wherein the resistive structure has a first length along a first direction which is parallel to a primary routing direction of the metal layer, wherein the resistive structure has a second length along a second direction which is parallel to the metal layer and perpendicular to the first direction, wherein the resistive structure has a third length along a third direction which is directed away from the metal layer and perpendicular to the first direction and the second direction, and wherein the third length is greater than the second length.

* * * * *